United States Patent [19]
Aisaka

[11] Patent Number: 5,335,369
[45] Date of Patent: Aug. 2, 1994

[54] AUTOMATIC POWER CONTROL CIRCUIT FOR USE WITH A RADIO TELECOMMUNICATION APPARATUS

[75] Inventor: Hideki Aisaka, Tokyo, Japan

[73] Assignee: Kabushiki Kaisha Toshiba, Kawasaki, Japan

[21] Appl. No.: 703,807

[22] Filed: May 21, 1991

[30] Foreign Application Priority Data

May 21, 1990 [JP] Japan .................. 2-129224

[51] Int. Cl.⁵ .............................. H04B 1/04
[52] U.S. Cl. ...................... 455/116; 455/426
[58] Field of Search ............... 455/115–117, 455/126, 127

[56] References Cited

U.S. PATENT DOCUMENTS

| | | | |
|---|---|---|---|
| 3,891,926 | 6/1975 | Ishman et al. | 455/126 |
| 4,011,512 | 3/1977 | Drury | 455/126 |
| 4,019,150 | 4/1977 | Lurey et al. | 455/126 |
| 4,044,308 | 8/1977 | Stites et al. | 455/126 |
| 4,563,775 | 1/1986 | Yokosuka | 455/126 |
| 4,570,127 | 2/1986 | Tanimoto et al. | 330/137 |
| 4,754,231 | 6/1988 | Sawa | 330/279 |
| 5,113,525 | 5/1992 | Andoh | 455/127 |

FOREIGN PATENT DOCUMENTS

| | | | |
|---|---|---|---|
| 2637270 | 8/1976 | Fed. Rep. of Germany | 455/117 |
| 54-112111 | 9/1979 | Japan . | |

Primary Examiner—Reinhard J. Eisenzopf
Assistant Examiner—Chi Pham
Attorney, Agent, or Firm—Banner, Birch, McKie & Beckett

[57] ABSTRACT

An automatic power control (APC) circuit for use with a radio telecommunication apparatus. The apparatus transmits radio frequency signals at a power level prescribed by a level control signal. In the automatic power control circuit, transmission power level is detected from the output of a duplexer. Accordingly, even if signal loss in a filter of the duplexer varies on the frequency of signals passing therethrough, transmission power level is accurately detected and the detected level is feedbacked to an amplifier of the APC circuit.

9 Claims, 4 Drawing Sheets

AUTOMATIC POWER CONTROL CIRCUIT FOR USE WITH A RADIO TELECOMMUNICATION APPARATUS

CROSS REFERENCE TO RELATED APPLICATIONS

The present invention is related to commonly assigned U.S. Pat. No. 4,754,231 to Buntaro Sawa, issued Jun. 28, 1988, entitled "Automatic Control Circuitry for a Signal Power Amplifier". The related patent, in its entirety, is incorporated herein by reference.

BACKGROUND OF THE INVENTION

1. Field of the Invention

This invention relates to an automatic power control circuit, such as for use with a radio telecommunication apparatus. More specifically, this invention relates to an automatic power control circuit designed to stabilize a transmission output of a radio telecommunication apparatus.

2. Description of the Prior Art

Automatic power control (APC) circuits have been used with such radio telecommunication devices as cellular mobile telephone systems and the like. With particular reference to FIG. 1, the structure and operation of a conventional APC circuit can be described.

An APC circuit is shown generally at 21. Typically, APC circuitry is used in conjunction with peripheral circuit elements, such as reference signal generating circuit 22, band pass filter 23 and antenna 24.

APC circuit 21 consists of voltage detection circuit 25, comparator 26 and power amplifier 27. As illustrated in FIG. 1, an input signal is input to power amplifier 27, where the signal is amplified and supplied to both band pass filter 23 and voltage detection circuit 25.

Voltage detection circuit 25 then rectifies the signal and detects its output voltage. The detected voltage is input to comparator 26. Additionally, a reference signal, by which the transmission output of power amplifier 27 is determined, is also input to comparator 26 from reference signal generating circuit 22. At comparator 26, the output voltage from detection circuit 25 and the reference signal from reference signal generating circuit 22 are compared. If the result of the comparison indicates that the output voltage is not at the same level as that of the reference signal, the power output from power amplifier 27 is adjusted so that the level of the output voltage detected in the detection circuit 25 is equalized with that of the reference signal.

Using such APC circuit, a signal having a constant output level is input to the band pass filter. Thus, unnecessary or spurious signals, such as harmonic distortion, can be removed from the input signal before being output from antenna 24.

FIG. 2 shows the electrical characteristics of band pass filter 23. In the case of an automobile phone system, for example, 832 channels are assigned at respective frequencies in the band defined between $f_L$ (824 MHz) and $f_H$ (849 MHz), with center channel $f_C$ in the middle of the band (836.5 MHz). When the reference signal for the transmission output from the APC circuit is set in accordance with the center channel $f_C$, loss of the transmission output, due to the band pass filter's frequency characteristics, is very slight for channel frequencies near fC. However, at channel frequencies approaching fL and fH, output deviation A (loss of output) between the channels increases. As a result, actual output will deviate from channel to channel.

The prior art APC circuitry detects the transmission output immediately after power amplification and immediately before filtering. Thus, the transmission output will inevitably deviate from one channel to another, as described above, due to the influence of the frequency characteristics of the band pass filter. This has been a major disadvantage of conventional prior art APC circuits.

SUMMARY OF THE INVENTION

It is therefore an object of the present invention to provide an improved automatic power control circuit which is capable of stabilizing transmission power level in accordance with a level control signal.

It is a further object of the present invention to provide an improved automatic power control circuit whereby the output power level feedback to an amplifier is accurately detected and measured.

It is a further object of the present invention to provide an improved automatic power control circuit whereby the transmission output does not deviate at frequencies near the edges of a band width.

The present invention provides an automatic power control (APC) circuit for use with a radio telecommunication apparatus for transmitting radio frequency signals via an antenna which are controlled by a level control signal. The APC circuit includes an amplifier for amplifying radio frequency signals; a filter coupled to the output of the amplifier for extracting signals of a predetermined frequency range from radio frequency signals which are applied to it; a detector coupled to the output of the filter for detecting the level of output signals from the filter; a comparator coupled to the detector means for comparing the detected level with the level control signal; and a controller for controlling the amplification factor of the amplifier in accordance with the output of the comparator.

According to another aspect of the present invention, an automatic power control (APC) circuit is provided for use with a radio telecommunication apparatus having a transmitter for transmitting radio frequency signals of a first range of frequencies through an antenna, and having a receiver for receiving radio frequency signals of a second range of frequencies through the antenna. The level of the transmission signals is controlled by a level control signal. The APC circuit includes an amplifier for amplifying radio frequency signals by an amplification factor; a duplexer, coupled to the output of the amplifier, the receiver and the antenna, for extracting signals of a first range of frequencies from radio frequency signals applied from the amplifyier and applying the extracted signals to the antenna, and for extracting signals of a second range of frequencies from radio frequency signals applied from the antenna and applying the extracted signals to the receiver; a detector provided between the duplexer means and the antenna for detecting the level of radio frequency signals output from the duplexer to the antenna; and a level controller coupled to the detector for controlling the amplification factor of the amplifier in accordance with both the output of the detector and the level control signal.

DETAILED DESCRIPTION OF THE PREFERRED EMBODIMENT

An APC circuit according to the present invention will now be explained with reference to the Figures. Although the APC circuit of the present invention will be described for use with a cellular radio telephone, it may easily be employed with a variety of wireless communications devices, such as a push-to-talk type communication device, by one of ordinary skill.

Figure 1:
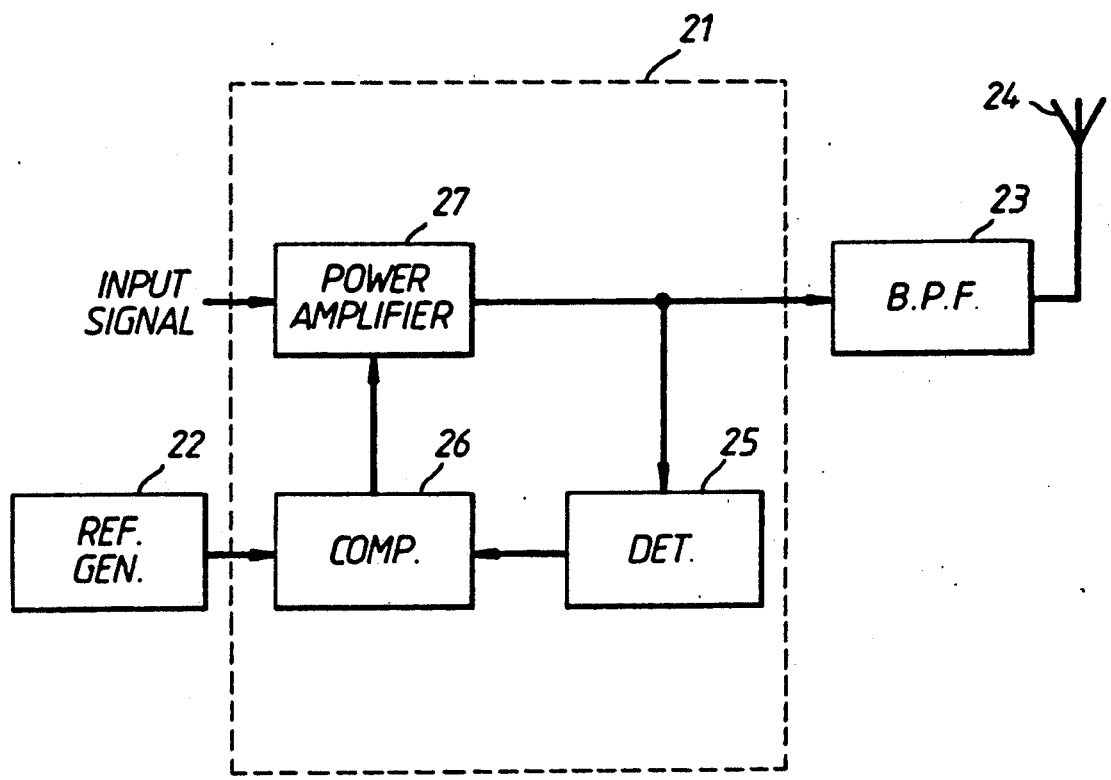
FIG. 1 is a block diagram of a conventional automatic power control circuit.
Figure 2:
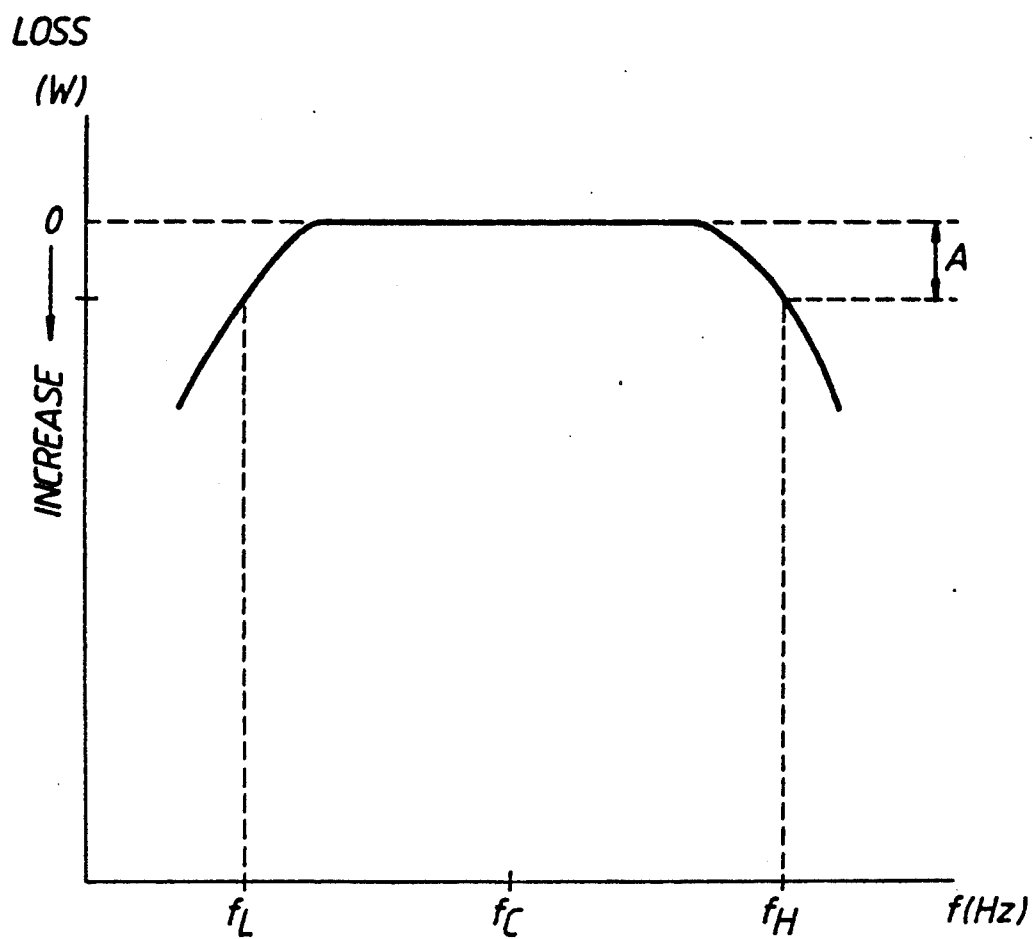
FIG. 2 is a graph showing the frequency characteristics of a filter provided in a conventional duplexer.
Figure 3:
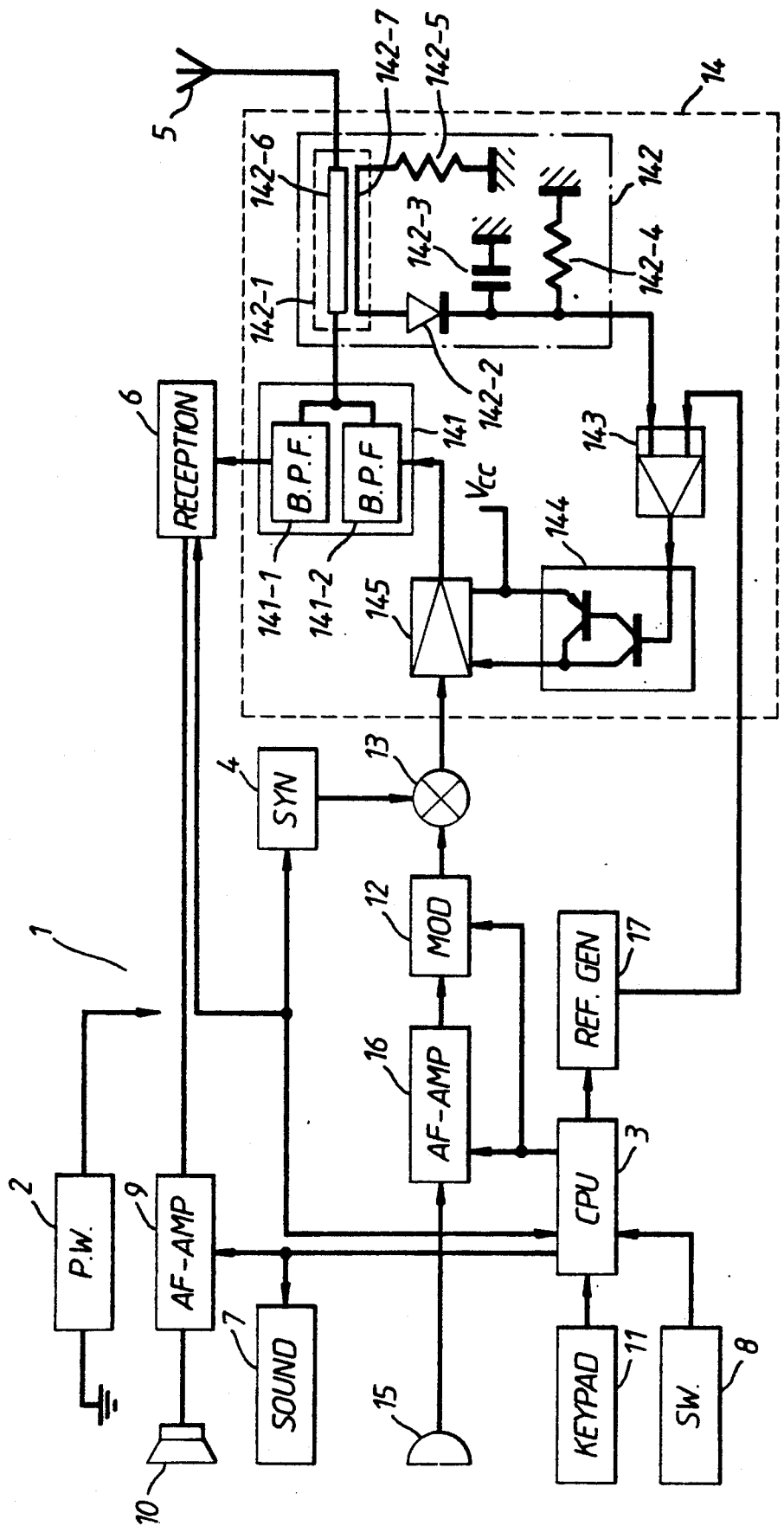
FIG. 3 is a block diagram of an automatic power control circuit according to the present invention, used in conjunction with a cellular radio telephone.

FIG. 3 depicts a circuit block diagram for illustrating the structure and operation of a cellular radio telephone and, specifically, for describing the APC circuit of the present invention used with the cellular radio telephone. Cellular unit 1 includes power source 2, central processing unit (CPU) 3, synthesizer 4, antenna 5, reception device and transmission device.

The reception device further includes reception circuit 6, sound alarm 7, off-hook switch 8, audio frequency amplifier (AF-AMP) 9 and receiver 10.

The transmission device further includes key pad 11, modulation circuit 12, mixer 13, APC circuit 14, transmitter 15, AF-AMP 16 and reference signal generating circuit 17. Reference signal generating circuit 17 may be of the type disclosed in U.S. Pat. No. 4,754,231, which provides several steps of voltage corresponding to a level control signal. In a cellular telephone apparatus, the level control signal may be transmitted from a base station.

APC circuit 14 includes duplexer 141, having signal-receiving band pass filter 141-1 and signal-transmitting band pass filter 141-2. Detection circuit 142 includes a directional coupler, connected between duplexer 141 and antenna 5; a comparator 143, which in a preferred embodiment is an operational amplifier; a voltage control circuit 144, which in a preferred embodiment is a transistor; and a power amplifier 145.

Duplexer 141 extracts transmission signals from radio frequency signals which are applied from power amplifier 145. The extracted transmission signals are then sent to antenna 5 through detection circuit 142. In addition, duplexer 141 extracts reception signals from radio frequency signals which are applied from antenna 5. The extracted reception signals are then applied to the reception circuit 6.

Detection circuit 142 further includes directional coupler 142-1 and diode 142-2 for half-wave rectifying a part, e.g., 1/10th, of a transmission signal passing through the directional coupler after it has been extracted from the signal. Capacitor 142-3 and resistor 142-4 are provided to smooth the extracted part of the signal which has been half-wave rectified by the diode. Resistor 142-5 is provided to absorb signals, such as a reception signal, traveling from antenna 5 to duplexer 141. Directional coupler 142-1 includes main line 142-6 and coupling line 142-7.

A signal used for setting a transmission or reception frequency is supplied from synthesizer 4 to the transmission side as well as to the reception side (reception circuit 6). The frequency range for transmission signals may be between 824 MHz and 849 MHz, with 832 radio channels assigned. The frequency range for receiving signals may be between 869 MHz and 894 MHz, with 832 radio channels assigned. It will be appreciated that other ranges and numbers of channels may be utilized and the present invention is not limited in this respect.

The operation of reception in the cellular unit will now be described. Radio frequency signals are received by antenna 5, and transferred into reception circuit 6 via duplexer 141. The signal is demodulated in reception circuit 6 and, if it is an incoming call, input to CPU 3. In CPU 3, dial data contained in this signal is compared with dial data assigned to the particular cellular unit 1. If the data correspond, sound alarm 7 is activated to generate a calling alarm, e.g. a bell or buzzer. When a user activates the off-hook switch 8, sound alarm 7 is deactivated by CPU 3. At this point, the user may converse with the calling party using the cellular unit.

The transmission operation of the cellular unit is carried out as follows. The telephone number of a party to be called is input by means of key pad 11. The signal representing this number is passed through CPU 3 into modulation circuit 12, wherein it is modulated. The modulated signal is mixed with an oscillation output from synthesizer 4 by mixer 13, and then input to power amplifier 145. After amplification, the signal is transferred through duplexer 141 and antenna 5 to the air. The party called may then respond to this transmission to initiate a conversation.

The returning voice signal of the party called is received by antenna 5, and input to reception circuit 6 via shared circuit 141. The voice signal is demodulated by reception circuit 6. The demodulated signal is input to AF-AMP 9, where it is amplified and then transmitted to the user by means of receiver 10. Likewise, when the user speaks into transmitter 15, the voice signal is amplified in AF-AMP 16, modulated in modulation circuit 12, mixed with an oscillation output from synthesizer 4 by mixer 13 and then input to power amplifier 145. The amplified signal is then transferred by duplexer 141 and transmitted by antenna 5 into the air.

The operation of the APC circuit of the present invention will now be explained. As described above, when a predetermined signal is input to power amplifier 145, the signal is amplified thereby and then passed through duplexer 141 and antenna 5 into the air. However, at the same time, part (e.g., 1/10th the strength) of this signal is extracted to detection circuit 142. In detection circuit 142, the signal is detected, rectified and smoothed, and then passed on to comparator 143. Meanwhile, a reference level control signal used for determining the transmission output of the power amplifier 145, is input from reference signal generating circuit 17 to comparator 143. In comparator 143, the detected signal and the reference signal are compared with each other and an output is determined, based upon the result of the comparison, and is input to voltage control circuit 144. Voltage control circuit 144 regulates a collector-vs-emitter voltage (VCE) in accordance with the level of the signal input to the base of the transistor. The output from this voltage control circuit 144 is input to the power amplifier 145, so as to regulate the power of the amplifier 145 thereby.

Accordingly, even if the frequency of the assigned channel is not close to that of the center channel, and thereby the output level of the transmission signal is somewhat lowered when passing through the duplexer 141, this transmission output signal is detected by detection circuit 142, and amplifier 145 is controlled to raise its power in accordance with the result of the comparison. That is, the signal input to power amplifier 145 is amplified to a level somewhat higher than signals of center channels. Thus, even if the level of the transmission output signal, which has been amplified to the higher level, is lowered when it passes through duplexer 141, the output level upon transmission from antenna 5 is stabilized to the level of the reference signal.

Furthermore, if the level of the transmission output is raised to exceed that of the reference level, the transmission output signal is similarly detected. In accordance with the comparison result, power amplifier 145 is controlled to reduce its power. Thus, the signal input to the amplifier 145 is amplified to a lower level.

The APC of the present invention thereby regulates transmission output at a constant level in accordance with the reference signal by increasing or reducing the amplification factor of the amplifier appropriately. Additionally, any influence of the reception signal upon the detection of the present invention is rendered negligible.

According to the present invention, detection circuit 14 is provided immediately after duplexer 141 and before antenna 5, therefore the frequency characteristics of the band pass filter of duplexer 141 do not affect the level of transmission signals. Thus, a constant transmission output is maintained with respect to the reference signal.

Moreover, the use of a directional coupler as the detection circuit 142 enables detection of a signal with great accuracy. Improved accuracy of the transmission output signal produces better control of the power amplifier 145 and, hence, further stabilization of transmission output signals from antenna 5 and duplexer 141.

Figure 4:
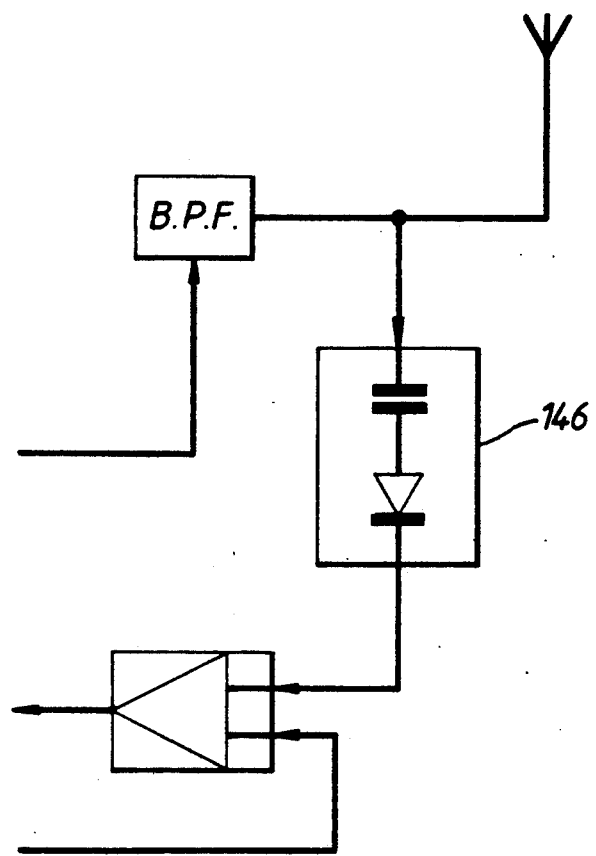
FIG. 4 is a block diagram showing a modification of the detection circuit of the automatic power control circuit of the present invention.

FIG. 4 illustrates a modification to the detection circuit of the present invention, which utilizes a capacitor and a diode 146. The invention may be further modified by omitting voltage control circuit 144 from APC circuit 14. Additionally, the detection circuit may be formed by a combination of the detection circuits illustrated in FIG. 3 (detection by a directional coupler) and 4 (detection by a capacitive couper). For example, referring to FIG. 3, a capacitor may be provided between coupling line 142-7 and diode 142-2.

Although this invention has been described in detail in connection with the preferred embodiments, they are to be understood as providing example only, and not to restrict the present invention. For example, the APC circuit has been described as part of a cellular telecommunications system. The APC circuit of the present invention may be used, however, with any wireless communication system. Other variations and modifications can easily be made within the scope of this invention, which is defined by the appended claims.

I claim:

1. An automatic power control circuit for use in a radio telecommunication apparatus, comprising:
    power amplifying means, having an amplification factor controlled in accordance with an amplifier control signal, for amplifying radio frequency signals;
    filtering means for filtering an output of said power amplifying means to select signals of a predetermined range of frequencies;
    detecting means for detecting a level of forward signals output from said filtering means;
    comparing means for comparing the detected level of said forward signals with an amplifier level control signal; and
    amplifier control signal generating means for generating the amplifier control signal for controlling the amplification factor of said power amplifying means in accordance with an output of said comparing means.

2. The automatic power control circuit of claim 1, wherein said detecting means comprises a directional coupler coupled to said filtering means, and a diode for rectifying a detection signal from said directional coupler.

3. The automatic power control circuit of claim 1, wherein said detecting means comprises a capacitor coupled to said filtering means, and a diode for rectifying a detection signal from said capacitor.

4. The automatic power control circuit of claim 1, wherein said amplifier control signal generating means generates a control voltage and applies the control voltage as the amplification factor.

5. An automatic power control circuit for use in a radio telecommunication apparatus having transmitting means for transmitting radio frequency signals of a first range of frequencies through an antenna and receiving means for receiving radio frequency signals of a second range of frequencies through said antenna, said automatic power control circuit comprising:
    power amplifying means, having an amplification factor controlled in accordance with an amplifier control signal, for amplifying radio frequency signals for transmission;
    a duplexer for filtering an output of said power amplifying means to select signals of a first range of frequencies and applying the selected signals to said antenna, and for filtering signals from said antenna to select signals of a second range of frequencies and applying the selected signals to said receiving means;
    detecting means connected between said duplexer and said antenna for detecting a level of radio frequency signals to be applied to said antenna; and
    amplifier control signal generating means for generating the amplifier control signal for controlling the amplification factor of said power amplifying means in accordance with an output of said detecting means and a level control signal.

6. The automatic power control circuit of claim 5, wherein said detecting means comprises a directional coupler connected between said duplexer and said antenna, and a diode for rectifying a detection signal from said directional coupler.

7. The automatic power control circuit of claim 5, wherein said detecting means comprises a capacitor coupled to said duplexer, and a diode for rectifying a detection signal from said capacitor.

8. The automatic power control circuit of claim 5, wherein said amplifier control signal generating means generates a control voltage and applies the control voltage to said power amplifying means as an amplification factor.

9. A radio telecommunication apparatus, comprising:
    transmitting means for transmitting radio frequency signals;
    receiving means for receiving radio frequency signals; and
    an automatic power control circuit including:

power amplifying means, having an amplification factor controlled in accordance with an amplifier control signal, for amplifying radio frequency signals;

filtering means for filtering an output of said power amplifying means to select signals of a predetermined range of frequencies;

detecting means for detecting a level of forward signals output from said filtering means;

comparing means for comparing the detected level of said forward signals with an amplifier level control signal; and amplifier control signal generating means for generating the amplifier control signal for controlling the amplification factor of said power amplifying means in accordance with an output of said comparing means.

* * * * *